(12) United States Patent
Wu et al.

(10) Patent No.: US 11,643,499 B2
(45) Date of Patent: May 9, 2023

(54) LIQUID MOLDING COMPOUND FOR PROTECTING FIVE EDGES OF SEMICONDUCTOR CHIP AND PREPARATION METHOD THEREOF

(71) Applicant: HUBEI CHOICE TECHNOLOGY CO., LTD., Ezhou (CN)

(72) Inventors: De Wu, Ezhou (CN); Shuhang Liao, Ezhou (CN); Yi Wang, Ezhou (CN); Junxing Su, Ezhou (CN); Shengquan Wang, Ezhou (CN)

(73) Assignee: HUBEI CHOICE TECHNOLOGY CO., LTD., Ezhou (CN)

( * ) Notice: Subject to any disclaimer, the term of this patent is extended or adjusted under 35 U.S.C. 154(b) by 0 days.

(21) Appl. No.: 17/911,431

(22) PCT Filed: Nov. 27, 2020

(86) PCT No.: PCT/CN2020/132155
§ 371 (c)(1),
(2) Date: Sep. 14, 2022

(87) PCT Pub. No.: WO2022/104878
PCT Pub. Date: May 27, 2022

(65) Prior Publication Data
US 2023/0094916 A1    Mar. 30, 2023

(30) Foreign Application Priority Data
Nov. 20, 2020  (CN) .......................... 202011313095.4

(51) Int. Cl.
C08G 59/62    (2006.01)
C09J 11/06    (2006.01)
C09J 11/04    (2006.01)
(Continued)

(52) U.S. Cl.
CPC ............ *C08G 59/621* (2013.01); *C08L 63/00* (2013.01); *C09J 11/04* (2013.01); *C09J 11/06* (2013.01);
(Continued)

(58) Field of Classification Search
CPC ........ C08G 59/621; C08G 59/62; C09J 11/04; C09J 11/06; C09J 11/08; C19J 163/00; C08L 97/005; C08K 5/5435; C08K 3/36
(Continued)

(56) References Cited

U.S. PATENT DOCUMENTS

| | | | |
|---|---|---|---|
| 2015/0017359 A1* | 1/2015 | Singer et al. | ........ C09D 143/02 523/100 |
| 2020/0144236 A1* | 5/2020 | Jang | ........................ H01L 25/16 |

FOREIGN PATENT DOCUMENTS

| | | |
|---|---|---|
| CN | 103436210 A | 12/2013 |
| CN | 104927733 A | 9/2015 |

(Continued)

OTHER PUBLICATIONS

Zhao Kai, et al., Epoxidation of Carboxyl-Terminated Liquid Nitrile Rubber and Its Toughening Effect on Epoxy Resin, Journal of East China University of Science and Technology (Natural Science Edition), 2014, pp. 702-708, vol. 40, No. 6.
(Continued)

*Primary Examiner* — Thinh T Nguyen
(74) *Attorney, Agent, or Firm* — Bayramoglu Law Offices LLC

(57) ABSTRACT

A liquid molding compound for protecting five edges of a semiconductor chip and a preparation method thereof are disclosed. The liquid molding compound includes 15 to 40 parts by mass of an epoxy resin, 15 to 35 parts by mass of a curing agent, 0.1 to 3 parts by mass of a curing accelerator, 4 to 15 parts by mass of a toughening agent, 75 to 150 parts
(Continued)

(Prior Art)

by mass of an inorganic filler, and 0.1 to 5 parts by mass of a coupling agent. The epoxy resin is one or more selected from the group consisting of a bisphenol A epoxy resin, a bisphenol F epoxy resin, and a biphenyl epoxy resin. The toughening agent is an adduct of an epoxy resin and a carboxyl-terminated liquid butyronitrile rubber, and the curing agent is a phenol-formaldehyde resin. The molding compound has a low coefficient of thermal expansion (CTE).

5 Claims, 1 Drawing Sheet

(51) Int. Cl.
    *C09J 163/00*     (2006.01)
    *C08L 63/00*     (2006.01)
    *C09J 11/08*     (2006.01)

(52) U.S. Cl.
    CPC ............. *C09J 11/08* (2013.01); *C09J 163/00* (2013.01); *C08L 2203/206* (2013.01)

(58) Field of Classification Search
    USPC .................................. 257/793; 438/124, 126
    See application file for complete search history.

(56) References Cited

FOREIGN PATENT DOCUMENTS

| CN | 104962224 A | 10/2015 |
| CN | 110527046 A | 12/2019 |
| CN | 111518499 A | 8/2020 |
| JP | 2005002311 A | 1/2005 |

OTHER PUBLICATIONS

ASTM E831-19, Standard Test Method for Linear Thermal Expansion of Solid Materials by Thermomechanical Analysis, ASTM International, 2019, pp. 1-4.

ASTM E1820-15, Standard Test Method for Measurement of Fracture Toughness, ASTM International, 2015, pp. 1-54.

ASTM D256-10 (Reapproved 2018), Standard Test Methods for Determining the Izod Pendulum Impact Resistance of Plastics, ASTM International, 2010 (R2018), pp. 1-20.

ASTM D1002-10, Standard Test Method for Apparent Shear Strength of Single-Lap-Joint Adhesively Bonded Metal Specimens by Tension Loading (Metal-to-Metal), ASTM International, 2010, pp. 1-6.

\* cited by examiner

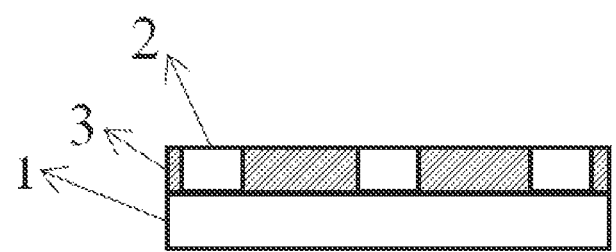
(Prior Art)

LIQUID MOLDING COMPOUND FOR PROTECTING FIVE EDGES OF SEMICONDUCTOR CHIP AND PREPARATION METHOD THEREOF

CROSS REFERENCE TO THE RELATED APPLICATIONS

This application is the national phase entry of International Application No. PCT/CN2020/132155, filed on Nov. 27, 2020, which is based upon and claims priority to Chinese Patent Application No. 202011313095.4, filed on Nov. 20, 2020, the entire contents of which are incorporated herein by reference.

TECHNICAL FIELD

The present disclosure belongs to the technical field of edge protection for semiconductor chips and, in particular, relates to a liquid molding compound for protecting five edges of a semiconductor chip and a preparation method thereof.

BACKGROUND

In the semiconductor field, silicon chip edge protection technology is widely used in advanced packaging manufacturing processes, especially in lithography procedures related to silicon chip metal plating. For example, key lithography procedures, such as bumping (BUMP) and redistribution layer (RDL) all require the use of silicon chip edge protection technology. Currently, an effective method is as follows: As shown in FIG. 1, a plurality of chips 2 are arranged on substrate 1, and an adhesive layer 3 is filled around each of the chips 2 to protect edges of the chips 2 and avoid damage to the chips 2, thereby improving the product reliability. The filled adhesive layer 3 can be quickly cured through natural flow and around the chips, increase the shock absorption performance of the chips, effectively reduce the impact caused by the mismatch of overall thermal expansion characteristics between the chips and the substrate or an external chip cutting force, and prevent solder joint oxidation. Molding compounds for edge protection of silicon chips need to have excellent impact resistance, adhesion, strength, and toughness. However, the current molding compounds have weak toughness, low impact resistance, and insufficient adhesion, and thus are generally easy to crack or even fall off when filled around silicon chips.

SUMMARY

Technical Problem

The present disclosure is intended to provide a liquid molding compound for protecting five edges of a semiconductor chip and a preparation method thereof to solve the problem that the existing molding compounds are generally easy to crack or even fall off when filled around silicon chips.

Technical Solution to the Problem

The present disclosure provides a liquid molding compound for protecting five edges of a semiconductor chip, including the following components:

| | |
|---|---|
| epoxy resin | 15 to 40 parts by mass; |
| curing agent | 15 to 35 parts by mass; |
| curing accelerator | 0.1 to 3 parts by mass; |
| toughening agent | 4 to 15 parts by mass; |
| inorganic filler | 75 to 150 parts by mass; and |
| coupling agent | 0.1 to 5 parts by mass; |

The epoxy resin is one or more selected from the group consisting of a bisphenol A epoxy resin, a bisphenol F epoxy resin, and a biphenyl epoxy resin.

The toughening agent is an adduct of an epoxy resin and a carboxyl-terminated liquid butyronitrile rubber.

The curing agent is a phenol-formaldehyde resin.

Further, the toughening agent may be one or more selected from the group consisting of an adduct of cyclohexanedimethanol diglycidyl ether and a carboxyl-terminated liquid butyronitrile rubber, an adduct of neopentyl glycol glycidyl ether and a carboxyl-terminated liquid butyronitrile rubber, an adduct of a bisphenol A epoxy resin and a carboxyl-terminated liquid butyronitrile rubber, and an adduct of a phenol-formaldehyde resin and a carboxyl-terminated liquid butyronitrile rubber.

The carboxyl-terminated liquid butyronitrile rubber can be polymerized from monomers of 2-acrylic acid, 1,3-butadiene, and 2-acrylonitrile.

Further, the curing agent may preferably be a phenol-aralkyl resin.

Further, the curing accelerator may be an imidazole curing accelerator.

Further, the inorganic filler may be silicon dioxide with a particle size of preferably 0.1 μm to 30 μm.

Further, the coupling agent may be a silane coupling agent (SCA).

Further, the SCA may be γ-glycidoxypropyltrimethoxysilane.

Further, the liquid molding compound may further include 0.1 to 3 parts by mass of a colorant.

The present disclosure provides a preparation method of the liquid molding compound for protecting five edges of a semiconductor chip, including:

mixing the epoxy resin, the curing agent, the curing accelerator, the toughening agent, the inorganic filler, and the coupling agent according to the parts by mass, grinding the resulting mixture until a gel is obtained, and vacuum-degassing to obtain the liquid molding compound.

Beneficial Effects of the Present Disclosure

Compared with the prior art, the present disclosure has the following characteristics and beneficial effects:

(1) A straight-chain epoxy resin (such as a bisphenol A epoxy resin, a bisphenol F epoxy resin, or a biphenyl epoxy resin) is selected and used in combination with a phenol-formaldehyde resin, which can significantly reduce the coefficient of thermal expansion (CTE) of the molding compound. An epoxy-modified butyronitrile rubber is added, and the epoxy-modified butyronitrile rubber can cooperate with the straight-chain epoxy resin and phenol-formaldehyde resin to significantly improve the toughness of the molding compound, increase the impact strength, and enhance the bonding capacity.

(2) The molding compound of the present disclosure has a low CTE and exhibits significantly-enhanced silicon adhesion, fracture toughness, and impact strength. When used for edge protection and reinforcement of a semiconductor chip, the molding compound will not crack or fall off.

BRIEF DESCRIPTION OF THE DRAWINGS

FIG. 1 is a schematic diagram illustrating the edge protection of a silicon chip, where 1 represents a substrate, 2 represents a chip, and 3 represents an adhesive layer.

DETAILED DESCRIPTION OF THE EMBODIMENTS

In order to make the objectives, technical solutions, and advantages of the present disclosure more comprehensible, specific implementations of the present disclosure are described in further detail below. It should be understood that the specific implementations described are merely intended to explain the present disclosure, rather than to limit the present disclosure.

The present disclosure provides a liquid molding compound for protecting five edges of a semiconductor chip, including 15 to 40 parts by mass of an epoxy resin, 15 to 35 parts by mass of a curing agent, 0.1 to 3 parts by mass of a curing accelerator, 4 to 15 parts by mass of a toughening agent, 75 to 150 parts by mass of an inorganic filler, and 0.1 to 5 parts by mass of a coupling agent. The epoxy resin is one or more selected from the group consisting of a bisphenol A epoxy resin, a bisphenol F epoxy resin, and a biphenyl epoxy resin. The toughening agent is an adduct of an epoxy resin and a carboxyl-terminated liquid butyronitrile rubber. The curing agent is a phenol-formaldehyde resin, which may preferably be a phenol-aralkyl resin, such as a commercially-available liquid phenol-formaldehyde resin product MEH-8000H.

The epoxy resin may be used preferably in 15 to 30 parts by mass or 30 to 40 parts by mass. The curing agent may be used preferably in 15 to 25 parts by mass or 25 to 35 parts by mass. The toughening agent may be used preferably in 4 to 6 parts by mass, 4 to 10 parts by mass, 6 to 10 parts by mass, 6 to 15 parts by mass, or 10 to 15 parts by mass. The inorganic filler may be used preferably in 75 to 100 parts by mass, 75 to 110 parts by mass, 75 to 150 parts by mass, 100 to 110 parts by mass, 100 to 150 parts by mass, or 110 to 150 parts by mass.

The toughening agent may specifically be selected from the group consisting of an adduct of cyclohexanedimethanol diglycidyl ether and a carboxyl-terminated liquid butyronitrile rubber CTBN1300X13 (such as a product HyPox® RM22 on the market), an adduct of neopentyl glycol glycidyl ether and a carboxyl-terminated liquid butyronitrile rubber CTBN1300X8 (such as a product HyPox® RM20 on the market), an adduct of a bisphenol A epoxy resin and a carboxyl-terminated liquid butyronitrile rubber CTBN1300X8 (such as a product HyPox® RA 840 on the market), and an adduct of a phenol-formaldehyde resin and a carboxyl-terminated liquid butyronitrile rubber CTBN1300X13 (such as a product HyPox® RA 928 on the market).

The curing accelerator may preferably be an imidazole curing accelerator, such as imidazole curing accelerators 2E4MZ, 2PZ®, and 2PHZ on the market. The curing accelerator can be used in a conventional amount. The inorganic filler can be a conventional inorganic filler, such as silicon dioxide, calcium silicate, or boron nitride, preferably silicon dioxide. The coupling agent is used for forming an organic matrix-coupling agent-inorganic matrix bonding layer to connect two materials with different properties. In the present disclosure, the coupling agent may preferably be an SCA and may specifically be γ-glycidoxypropyltrimethoxysilane. The liquid molding compound of the present disclosure may further include 0.1 to 3 parts by mass of a colorant, and the colorant is used to provide a color for the liquid molding. Specifically, a pigment, such as carbon black, can be used. The colorant is a non-essential component.

A specific preparation method of the liquid molding compound of the present disclosure includes: The epoxy resin, the curing agent, the curing accelerator, the toughening agent, the inorganic filler, and the coupling agent are mixed according to the parts by mass, ground until a gel is obtained, and vacuum-degassed to obtain the liquid molding compound.

In order to further prove the advantages of the liquid molding compound of the present disclosure, the following comparison tests are conducted. In the following examples and comparative examples, the curing agent is a mixture of a liquid phenol-formaldehyde resin MEH-8000H and methylhexahydrophthalic anhydride (MHHPA); the curing accelerator is a curing accelerator 2E4MZ on the market; the toughening agent is a product HyPox® RM22 on the market; the filler is silicon dioxide; the colorant is carbon black; and the coupling agent is γ-glycidoxypropyltrimethoxysilane.

Formulas of the examples and comparative examples are shown in Table 1. The products obtained in the examples and comparative examples are each tested for CTE1, silicon adhesion, fracture toughness, and impact strength, and test results are shown in Table 1.

In this example, the CTE1 was tested as follows: The liquid molding compound was cured at 150C/1H to prepare a sample meeting the requirements of the standard ASTM E831-2019, and then the CTE of the sample was determined. The fracture toughness K1c was tested according to a method in the standard ASTM E1820-2015, The impact strength was tested according to a method in the standard ASTM D256-2010(R2018). The silicon adhesion was tested as follows: With reference to the standard ASTM D1002-2010, the liquid molding compound was spotted on a square area of 5 mm×5 mm on the surface of a silicon wafer, then cured at 180° C. for 1 h, and tested with a universal tensile testing machine for shear bond strength.

TABLE 1

| Formulas and test results of the examples and comparative examples | | | | | | |
|---|---|---|---|---|---|---|
| | Example 1 | Example 2 | Example 3 | Example 4 | Comparative Example 1 | Comparative Example 2 |
| Bisphenol A epoxy resin | / | / | 30 parts by mass | 30 parts by mass | / | 30 parts by mass |
| Bisphenol F epoxy resin | 15 parts by mass | 40 parts by mass | / | / | 40 parts by mass | / |

TABLE 1-continued

Formulas and test results of the examples and comparative examples

| | Example 1 | Example 2 | Example 3 | Example 4 | Comparative Example 1 | Comparative Example 2 |
|---|---|---|---|---|---|---|
| Liquid phenol-formaldehyde resin MEH-8000H | 15 parts by mass | 35 parts by mass | 25 parts by mass | 25 parts by mass | / | 25 parts by mass |
| MHHPA | / | / | / | / | 40 parts by mass | / |
| 2E4MZ | 0.2 part by mass | 0.3 part by mass | 0.3 part by mass | 0.3 part by mass | 0.3 part by mass | 0.3 part by mass |
| HyPox ® RM22 | 6 parts by mass | 4 parts by mass | 10 parts by mass | 15 parts by mass | 4 parts by mass | / |
| Silicon dioxide | 100 parts by mass | 110 parts by mass | 75 parts by mass | 150 parts by mass | 100 parts by mass | 75 parts by mass |
| γ-glycidoxypropyltrimethoxysilane | 0.3 part by mass | 0.3 part by mass | 0.2 part by mass | 0.3 part by mass | 0.3 part by mass | 0.2 part by mass |
| Carbon black | 0.2 part by mass | 0.2 part by mass | 0.2 part by mass | 0.2 part by mass | 0.2 part by mass | 0.2 part by mass |
| CTE1 (unit: ppm/° C.) | 21 | 24 | 25 | 22 | 30 | 30 |
| Silicon adhesion (unit: MPa) | 34 | 32 | 37 | 38 | 25 | 22 |
| Fracture toughness K1c | 3.6 | 3.5 | 3.8 | 3.9 | 2.9 | 2.3 |
| Impact strength (unit: J/m) | 178 | 178 | 181 | 186 | 154 | 132 |

It can be seen from Table 1 that, when a phenol-formaldehyde resin is used as a curing agent and an epoxy-modified butyronitrile rubber is used as a toughening agent, the molding compound has a low CTE and high silicon adhesion, fracture toughness, and impact strength, which can prevent the cracking and falling-off of the molding compound.

In view of the above-mentioned examples, it should be noted that the curing accelerator, coupling agent, and colorant in the present disclosure have no decisive influence on the properties of the liquid molding compound and can be added in conventional amounts. For the convenience of comparison, the amounts of the curing accelerator, coupling agent, and colorant in the examples remain unchanged.

The above examples are only some of the various examples of the present disclosure. Changes or modifications in different forms can be made by those skilled in the art based on the above description, and these changes or modifications derived from the essence or spirit of the present disclosure still fall within the protection scope of the present disclosure.

What is claimed is:

1. A liquid molding compound for protecting five edges of a semiconductor chip, comprising the following components:

| | |
|---|---|
| an epoxy resin | 15 to 40 parts by mass; |
| a curing agent | 15 to 35 parts by mass; |
| a curing accelerator | 0.1 to 3 parts by mass; |
| a toughening agent | 4 to 15 parts by mass; |
| an inorganic filler | 75 to 150 parts by mass; and |
| a coupling agent | 0.1 to 5 parts by mass; | wherein the epoxy resin is selected from the group consisting of a bisphenol A epoxy resin and a bisphenol F epoxy resin;
the toughening agent is one or more selected from the group consisting of an adduct of cyclohexanedimethanol diglycidyl ether and a carboxyl-terminated liquid butyronitrile rubber, an adduct of neopentyl glycol glycidyl ether and a carboxyl-terminated liquid butyronitrile rubber, an adduct of a bisphenol A epoxy resin and a carboxyl-terminated liquid butyronitrile rubber, and an adduct of a phenol-formaldehyde resin and a carboxyl-terminated liquid butyronitrile rubber;
the curing agent is configured in a phenol-aralkyl resin;
the curing accelerator is configured in an imidazole curing accelerator and
the inorganic filler is silicon dioxide with a particle size of 0.1 μm to 30 μm.

2. The liquid molding compound for protecting the five edges of the semiconductor chip according to claim 1, wherein the coupling agent is a silane coupling agent (SCA).

3. The liquid molding compound for protecting the five edges of the semiconductor chip according to claim 2, wherein the SCA is γ-glycidoxypropyltrimethoxysilane.

4. The liquid molding compound for protecting the five edges of the semiconductor chip according to claim 1, further comprising: 0.1 to 3 parts by mass of a colorant.

5. A preparation method of the liquid molding compound for protecting the five edges of the semiconductor chip according to claim 1, comprising:
mixing the epoxy resin, the curing agent, the curing accelerator, the toughening agent, the inorganic filler, and the coupling agent according to the parts by mass, grinding until a gel is obtained, and vacuum-degassing to obtain the liquid molding compound.

* * * * *